United States Patent
Lee et al.

(10) Patent No.: US 11,658,417 B2
(45) Date of Patent: May 23, 2023

(54) ANTENNA SUBSTRATE

(71) Applicant: SAMSUNG ELECTRO-MECHANICS CO., LTD., Suwon-si (KR)

(72) Inventors: Yang Je Lee, Suwon-si (KR); Chang Gun Oh, Suwon-si (KR); Hyun Kyung Park, Suwon-si (KR); Je Sang Park, Suwon-si (KR); Sang Ho Jeong, Suwon-si (KR); Yong Duk Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 107 days.

(21) Appl. No.: 17/208,139

(22) Filed: Mar. 22, 2021

(65) Prior Publication Data
US 2022/0190479 A1    Jun. 16, 2022

(30) Foreign Application Priority Data
Dec. 14, 2020    (KR) .......................... 10-2020-0174647

(51) Int. Cl.
*H01Q 9/04*    (2006.01)
*H01Q 1/22*    (2006.01)
*H05K 1/11*    (2006.01)

(52) U.S. Cl.
CPC ............. *H01Q 9/0407* (2013.01); *H01Q 1/22* (2013.01); *H05K 1/113* (2013.01); *H05K 2201/10098* (2013.01)

(58) Field of Classification Search
CPC ...... H01Q 9/0407; H01Q 9/0414; H01Q 1/38; H05K 1/11; H05K 1/111–113; H05K 2201/10; H05K 2201/10007; H05K 2201/10098
See application file for complete search history.

(56) References Cited

U.S. PATENT DOCUMENTS

| 2006/0214798 | A1* | 9/2006 | Wang ..................... G06Q 10/00 340/572.1 |
| 2016/0043470 | A1 | 2/2016 | Ko et al. |
| 2016/0276734 | A1 | 9/2016 | Jin et al. |
| 2020/0098709 | A1* | 3/2020 | Lin .................... H01L 23/49822 |
| 2021/0175627 | A1* | 6/2021 | Yl ............................ H01Q 1/38 |
| 2021/0376473 | A1* | 12/2021 | Lee ......................... H01Q 1/22 |
| 2022/0190479 | A1* | 6/2022 | Lee ........................ H05K 1/113 |
| 2023/0066381 | A1* | 3/2023 | Lee ...................... H05K 1/0298 |

FOREIGN PATENT DOCUMENTS

| KR | 10-2016-0112154 A | 9/2016 |
| KR | 10-2151425 B1 | 9/2020 |

* cited by examiner

*Primary Examiner* — Jason Crawford
(74) *Attorney, Agent, or Firm* — Morgan, Lewis & Bockius LLP

(57) ABSTRACT

An antenna substrate includes: a body having a first surface and a second surface opposing each other and a side surface connecting the first surface and the second surface to each other; an antenna portion disposed on the first surface of the body; and a pad portion disposed in the body, exposed to the side surface of the body, and including a plurality of pad layers connected to each other in a first direction from the second surface of the body toward the first surface of the body. At least one of the plurality of pad layers has a greater width in a second direction than in a third direction perpendicular to the second direction when viewed in the first direction.

18 Claims, 9 Drawing Sheets

ANTENNA SUBSTRATE

CROSS-REFERENCE TO RELATED APPLICATION(S)

The present application claims the benefit of priority to Korean Patent Application No. 10-2020-0174647, filed on Dec. 14, 2020 in the Korean Intellectual Property Office, the disclosure of which is incorporated herein by reference in its entirety.

TECHNICAL FIELD

The present disclosure relates to an antenna substrate.

BACKGROUND

Recently, services and markets for 5G communications have rapidly expanded in order to transmit large amounts of data at ultra-high speeds. Therefore, the development of technology for realizing an antenna substrate having low signal loss has been conducted.

SUMMARY

An aspect of the present disclosure may provide an antenna substrate for realizing an antenna having a vertical structure without using a separate cable substrate.

According to an aspect of the present disclosure, an antenna substrate may include: a body having one surface and the other surface opposing each other and a side surface connecting the one surface and the other surface to each other; an antenna portion disposed on the one surface of the body; and a pad portion disposed in the body, exposed to the side surface of the body, and including a plurality of pad layers connected to each other in a first direction from the other surface of the body toward the one surface of the body, wherein at least one of the plurality of pad layers has a greater width in a second direction than in a third direction perpendicular to the second direction when viewed in the first direction from the other surface of the body toward the one surface of the body.

According to another aspect of the present disclosure, an antenna substrate may include: a body having a first surface and a second surface opposing each other and a side surface connecting the first surface and the second surface to each other; an antenna portion disposed on the first surface of the body; and a pad portion disposed in the body and including a plurality of pad layers each including a pattern layer and a via layer, wherein the pattern layer and the via layer of each of the plurality of pad layers are exposed to the side surface of the body.

According to still another aspect of the present disclosure, an antenna substrate may include: a body; an antenna portion disposed on a first surface of the body; and a pad portion disposed in the body, exposed to a side surface of the body perpendicular to the first surface of the body, and including a plurality of pad layers each including a pattern layer and a via layer, wherein on the side surface of the body, a width of the pattern layer is greater than a width the via layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

The meaning of a "connection" of a component to another component herein includes an indirect connection through an adhesive layer as well as a direct connection between two components. In addition, "electrically connected" conceptually includes a physical connection and a physical disconnection.

Terms "first", "second", and the like, herein are used to distinguish one component from another component, and do not limit a sequence, importance, and the like, of the corresponding components. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In addition, singular forms include plural forms unless interpreted otherwise in context.

Figure 1:
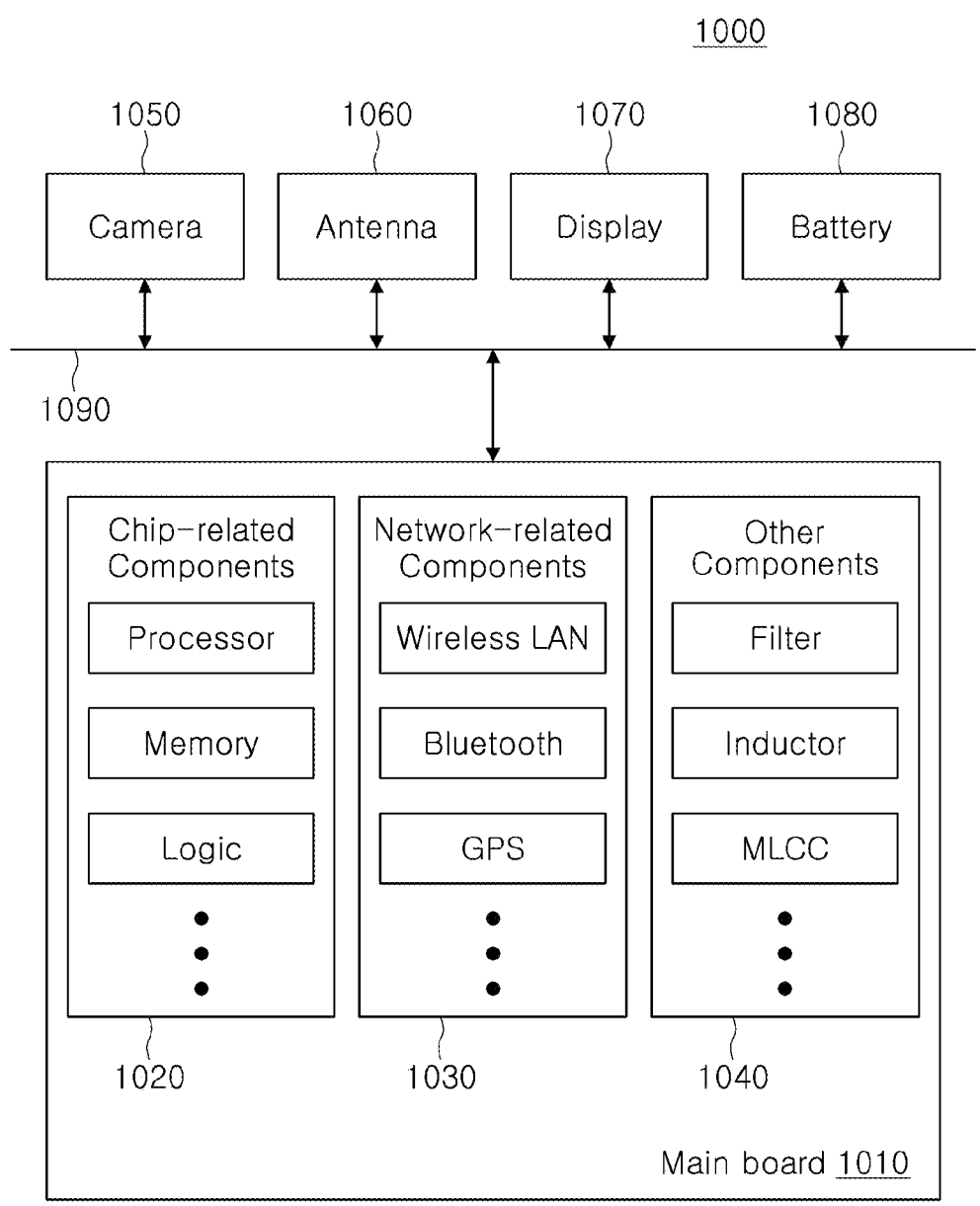
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other. These chip related components 1020 may have a package form including the chips or the electronic components described above.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, these other components 1040 are not limited thereto, but may also include chip component types of passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other electronic components may include, for example, a camera 1050, an antenna 1060, a display 1070, a battery 1080, or the like. These other electronic components are not limited thereto, and may be an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. These other electronic components may also include other electronic components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
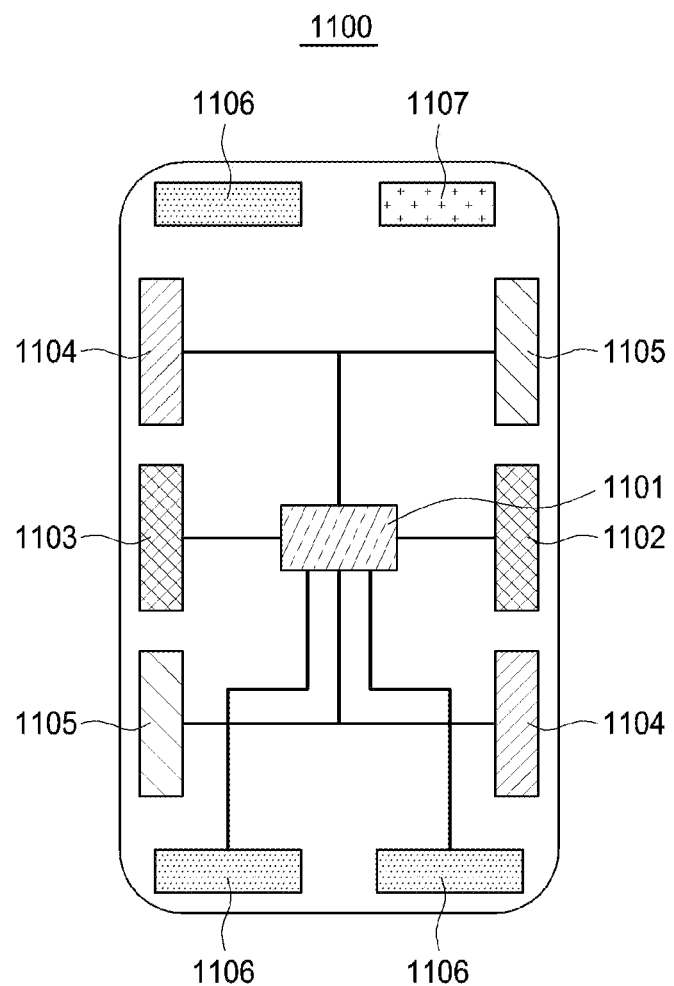
FIG. 2 is a schematic plan view illustrating an example of an electronic device.

FIG. 2 is a schematic plan view illustrating an example of an electronic device.

Referring to FIG. 2, an electronic device may be, for example, a smartphone 1100. A modem 1101 and various types of antenna modules 1102, 1103, 1104, 1105, and 1106 connected to the modem 1101 through a rigid printed circuit board, a flexible printed circuit board, and/or a rigid-flexible printed circuit board may be disposed in the smartphone 1100. A wireless fidelity (Wi-Fi) module 1107 may also be disposed in the smartphone 1100, if necessary. The antenna modules 1102, 1103, 1104, 1105, and 1106 may include antenna modules 1102, 1103, 1104, and 1105 having various frequency bands for 5G mobile communications, such as an antenna module 1102 for a 3.5 GHz band frequency, an antenna module 1103 for a 5 GHz band frequency, an antenna module 1104 for a 28 GHz band frequency, an antenna module 1105 for a 39 GHz band frequency, and the like and may also include other 4G antenna modules 1106, but are not limited thereto. Meanwhile, the electronic device is not necessarily limited to the smartphone 1100, but may be other electronic devices as described above.

Figure 3:
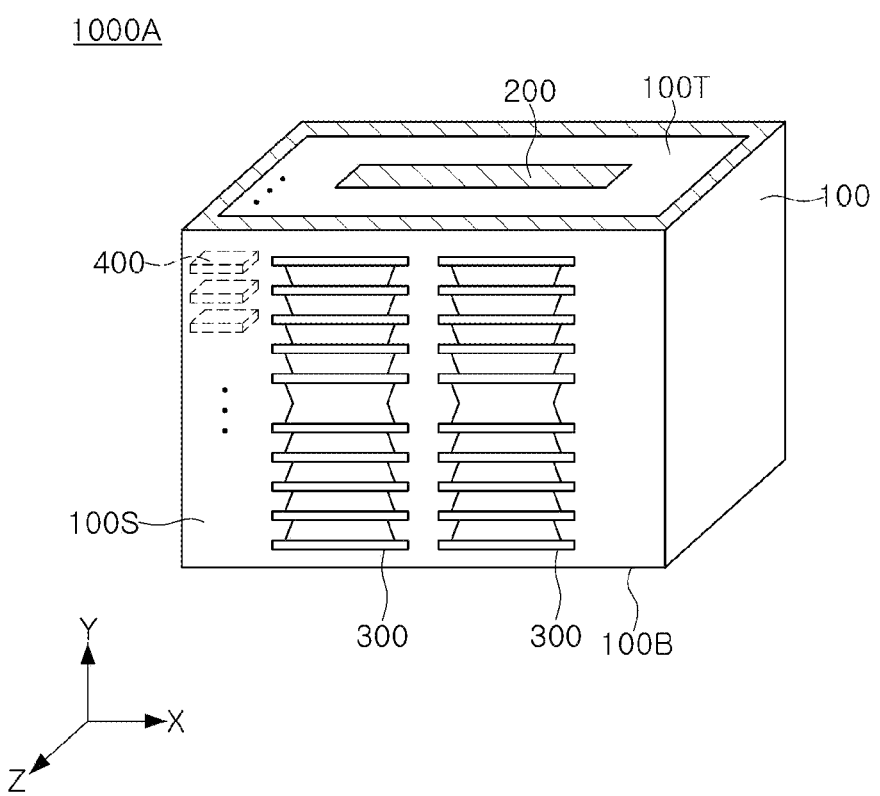
FIG. 3 is a schematic perspective view illustrating an antenna substrate according to an exemplary embodiment.

FIG. 3 is a schematic perspective view illustrating an antenna substrate according to an exemplary embodiment.

Figure 4:
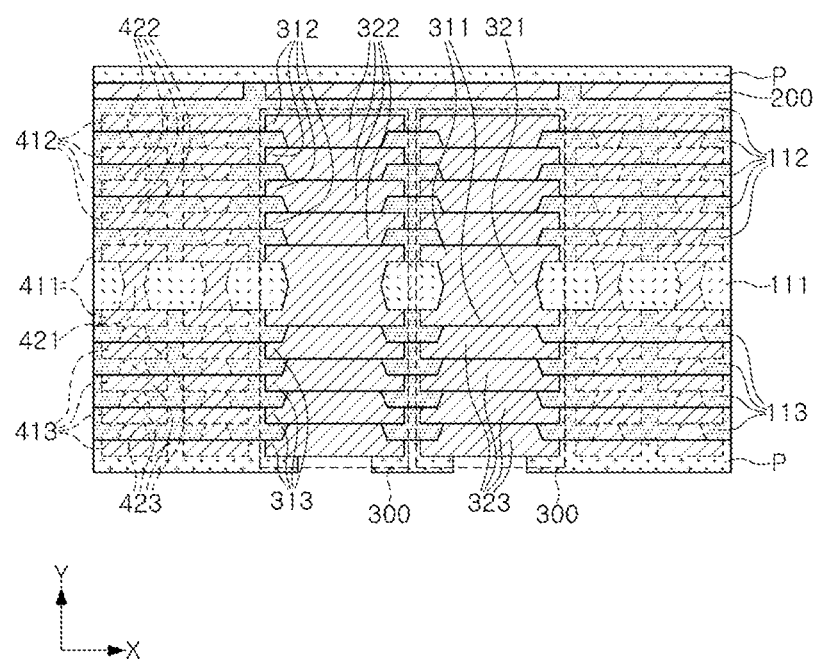
FIG. 4 is a cross-sectional view of the antenna substrate of FIG. 3 when viewed from a side surface of a body.

FIG. 4 is a cross-sectional view of the antenna substrate of FIG. 3 when viewed from a side surface of a body.

Figure 5:
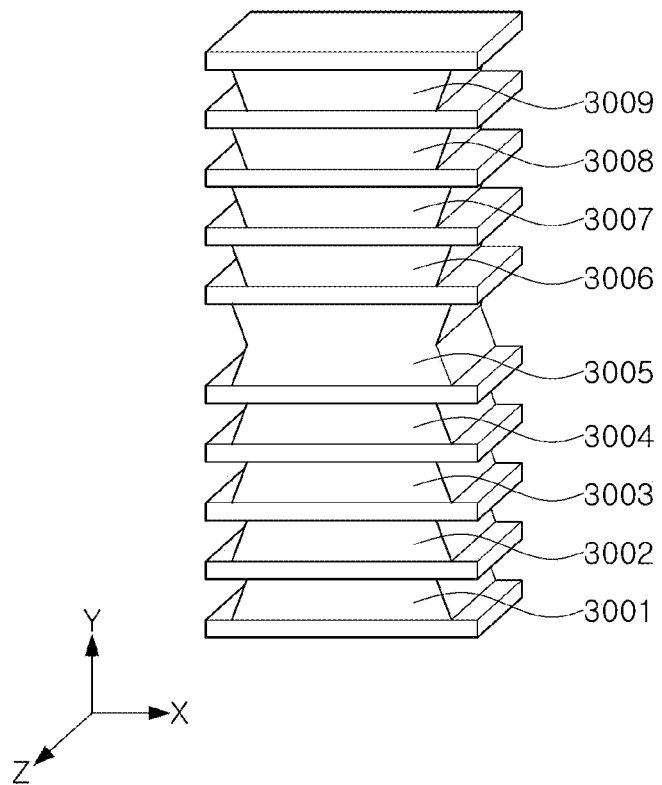
FIG. 5 is a schematic perspective view illustrating an example of a pad portion of FIG. 4.

FIG. 5 is a schematic perspective view illustrating an example of a pad portion of FIG. 4.

Referring to FIGS. 3 through 5, an antenna substrate 1000A may include a body 100 having a first surface 100T and a second surface 100B opposing each other and a side surface 100S connecting the first surface 100T and the second surface 100B to each other, an antenna portion 200 disposed on the first surface 100T of the body 100, and a pad portion 300 disposed in the body 100, exposed to the side surface 100S of the body 100, and including a plurality of pad layers 3001, 3002, 3003, 3004, 3005, 3006, 3007, 3008, and 3009 connected to each other in a Y direction from the second surface 100B of the body 100 toward the first surface 100T of the body 100. In addition, the antenna substrate 1000A may further include a wiring portion 400 disposed in the body 100.

The body 100 may form an appearance of the antenna substrate 1000A, and may serve to secure an insulation property in a region of the antenna substrate 1000A in which electrical connection is not required. The body 100 may have a rectangular parallelepiped shape having first surface 100T and the second surface 100B, and four side surfaces 100S connecting the first surface 100T and the second surface 100B to each other, but a shape of the body 100 is not limited thereto.

The body 100 may include a plurality of insulating layers 111, 112, and 113 stacked in the Y direction from the second surface 100B of the body 100 toward the first surface 100T of the body 100. Each of boundaries between the plurality of insulating layers 111, 112, and 113 may be apparent, but in a process of stacking each of the plurality of insulating layers 111, 112, and 113, each of the boundaries between the plurality of insulating layers 111, 112, and 113 may become inapparent, such that it may be difficult to confirm each of the boundaries with the naked eyes.

The plurality of insulating layers 111, 112, and 113 may include a core insulating layer 111 and a plurality of first and second build-up insulating layers 112 and 113 disposed on both sides of the core insulating layer 111 in the Y direction. A thickness of the core insulating layer 111 may be greater than that of each of the first and second build-up insulating layers 112 and 113.

Each of the plurality of insulating layers 111, 112, and 113 may include an insulating material. The insulating material may be a thermosetting resin such as an epoxy resin, a thermoplastic resin such as a polyimide resin, a material including a reinforcing material such as a woven glass fiber and/or an inorganic filler together with the thermosetting resin and the thermoplastic resin, for example, prepreg, an Ajinomoto build-up film (ABF), a photoimagable dielectric (PID), or the like.

Although not specifically illustrated, the antenna portion 200 may include a patch antenna. In this case, the patch antenna may be connected to a feed via to receive a radio frequency (RF) signal from the feed via or may transmit an RF signal to the feed via. However, the antenna portion 200 may include a monopole antenna, a dipole antenna, and/or a chip antenna, and may further include a patch antenna together with these antennas. In addition, the antenna portion 200 may further include an inner layer antenna disposed in the body 100.

The pad portion 300 may serve to mount the antenna substrate 1000A on another board such as a main board or the like. However, the pad portion 300 is not limited thereto, and may be a region in which an electronic component is mounted on the antenna substrate 1000A. The electronic component may include at least one of a power management integrated circuit (PMIC), a radio frequency integrated circuit (RFIC), and a passive component, but is not limited thereto.

The number of pad portions 300 is not particularly limited, and may be less than that illustrated in the drawings or be more than that illustrated in the drawings. For example, the number of pad portions 300 may be one or be three or less.

The pad portion 300 may include the plurality of pad layers 3001, 3002, 3003, 3004, 3005, 3006, 3007, 3008, and 3009. In this case, each of the plurality of pad layers 3001, 3002, 3003, 3004, 3005, 3006, 3007, 3008, and 3009 may be formed on each of the plurality of insulating layers 111, 112, and 113.

Each of the plurality of pad layers 3001, 3002, 3003, 3004, 3005, 3006, 3007, 3008, and 3009 may have a greater width in a second direction than in a third direction perpendicular to the second direction when viewed in the Y direction from the second surface 100B of the body 100 toward the first surface 100T of the body 100. In this case, the second direction may be an X direction parallel to the side surface 100S of the body 100, and the third direction may be a Z direction perpendicular to the side surface 100S of the body 100. As described later, the plurality of pad layers 3001, 3002, 3003, 3004, 3005, 3006, 3007, 3008, and 3009 may be formed by stacking vias having a bar shape to have such a structure.

Each of the plurality of pad layers 3001, 3002, 3003, 3004, 3005, 3006, 3007, 3008, and 3009 may include pattern layers 311, 312, and 313 and via layers 321, 322, and 323. In this case, the pattern layers 311, 312, and 313 and the via layers 321, 322, and 323 included in each of the plurality of pad layers 3001, 3002, 3003, 3004, 3005, 3006, 3007, 3008, 3009 may be formed on each of the plurality of insulating layers 111, 112, and 113. The pad portion 300 may have a structure in which a plurality of pattern layers 311, 312, and 313 and a plurality of via layers 321, 322, and 323 are alternately disposed in the Y direction.

Each of the pattern layers 311, 312, and 313 may be disposed on each of the plurality of insulating layers 111, 112, and 113. In this case, the pattern layers 311, 312, and 313 may overlap each other in the Y direction, which is a stacked direction of the plurality of insulating layers 111, 112, and 113.

The pattern layers 311, 312, and 313 may include a plurality of core wiring layers 311 and a plurality of first and second build-up wiring layers 312 and 313 disposed on both sides of the plurality of core wiring layers 311 in the Y direction. The plurality of core wiring layers 311 may be disposed on both surfaces of the core insulating layer 111 in the Y direction. Each of the plurality of first and second build-up wiring layers 312 and 313 may be disposed on each of the plurality of first and second build-up insulating layers 112 and 113 in the Y direction.

Each of the pattern layers 311, 312, and 313 may be formed of a conductive material such as copper (Cu), aluminum (Al), silver (Ag), tin (Sn), gold (Au), nickel (Ni), lead (Pb), titanium (Ti), or alloys thereof.

Each of the pattern layers 311, 312, and 313 may be formed by a known plating process. For example, the pattern layers 311, 312, and 313 may be formed by forming electroless plating layers serving as seed layers on the plurality of insulating layers 111, 112, and 113 by electroless plating and forming electroplating layers on the seed layers by electroplating, respectively.

Each of the via layers 321, 322, and 323 may penetrate through each of the plurality of insulating layers 111, 112, and 113. Therefore, the via layers 321, 322, and 323 may connect the pattern layers 311, 312, and 313 included in each of the plurality of pad layers 3001, 3002, 3003, 3004, 3005, 3006, 3007, 3008, and 3009 to each other. In this case, the via layers 321, 322, and 323 may also overlap in the Y direction, which is the stacking direction of the plurality of insulating layers 111, 112, and 113.

The via layers 321, 322, and 323 may include a core via layer 321 and a plurality of first and second build-up via layers 322 and 323 disposed on both sides of the core via layer 321 in the Y direction. The core via layer 321 may penetrate through the core insulating layer 111 in the Y direction and may connect the plurality of core wiring layers 311 disposed on both surfaces of the core insulating layer 111 to each other. The plurality of first and second build-up via layers 322 and 323 may penetrate through the plurality of first and second build-up insulating layers 112 and 113 in the Y direction, respectively, and may connect the plurality of first and second build-up wiring layers 312 and 313 and the plurality of core wiring layers 311 to each other.

Each of the via layers 321, 322, and 323 may be formed of a conductive material such as copper (Cu), aluminum (Al), silver (Ag), tin (Sn), gold (Au), nickel (Ni), lead (Pb), titanium (Ti), or alloys thereof.

Each of the via layers 321, 322, and 323 may be formed by a known plating process. For example, the via layers 321, 322, and 323 may be formed by via holes penetrating through the plurality of insulating layers 111, 112, and 113, forming electroless plating layers serving as seed layers on walls of the via holes by electroless plating, and forming electroplating layers on the seed layers by electroplating so as to fill the via holes, respectively. Each of the via layers 321, 322, and 323 may have a boundary with each of the pattern layers 311, 312, and 313 or may be integrated with each of the pattern layers 311, 312, and 313 without having a boundary with each of the pattern layers 311, 312, and 313.

Each of vias included in each of the via layers 321, 322, and 323 may be a filled-type via in which the via hole is completely filled with a metal or may be a via in which a metal is formed along the wall of the via hole. In addition, each of the vias included in each of the via layers 321, 322, and 323 may have various shapes such as a tapered shape, an hourglass shape and the like.

According to one exemplary embodiment, on the side surface 100S of the body 100, a width of each of the pattern layers 311, 312, and 313 may be greater than that of each of the via layers 321, 322, and 323. On the other hand, the width of each of the pattern layers 311, 312, and 313 and/or the via layers 321, 322, and 323 on the side surface 100S of the body 100 may not be constant. In this case, on the side surface of the body 100, a maximum width of each of the pattern layers 311, 312, and 313 may be greater than a maximum width of each of the via layers 321, 322, and 323.

On the side surface 100S of the body 100, the pad portion 300 and the body 100 may have a substantially coplanar surface with each other. In this case, on the side surface 100S of the body 100, each of the pattern layers 311, 312, and 313 and the via layers 321, 322, and 323 included in each of the plurality of pad layers 3001, 3002, 3003, 3004, 3005, 3006, 3007, 3008, 3009 may have a substantially coplanar surface with the body 100. One or ordinary skill in the art would understand that the expression "substantially coplanar" refers to lying on the same plane by allowing process errors, positional deviations, and/or measurement errors that may occur in a manufacturing process.

In the antenna substrate 1000A, such a structure may be realized by a process of forming the pattern layers 311, 312, and 313 and the via layers 321, 322, and 323 and then sawing the antenna substrate 1000A so that each of the pattern layers 311, 312, and 313 and the via layers 321, 322, and 323 is exposed to the side surface 100S of the body 100. Alternatively, in the antenna substrate 1000A, such a structure may be realized by a process of forming the pattern layers 311, 312, and 313 and the via layers 321, 322, and 323 and then performing laser processing on the antenna substrate 1000A so that each of the pattern layers 311, 312, and 313 and the via layers 321, 322, and 323 is exposed to the side surface 100S of the body 100. However, the present disclosure is not limited thereto, and various processes may be applied by a selection of those skilled in the art in order to realize a structure of the antenna substrate 1000A.

The wiring portion 400 may include a plurality of wiring layers 411, 412, and 413 and a plurality of vias 421, 422, and 423. The wiring portion 400 may be electrically connected to the pad portion 300 through at least one of the plurality of wiring layers 411, 412, and 413 and the plurality of vias 421, 422, and 423.

Each of the plurality of wiring layers 411, 412, and 413 may be disposed on each of the plurality of insulating layers 111, 112, and 113. Each of the plurality of wiring layers 411, 412, and 413 may be disposed on the same level as that of each of the plurality of pattern layers 311, 312, and 313. Each of the plurality of wiring layers 411, 412, and 413 may be formed on each of the plurality of insulating layers 111, 112, and 113 by the same process as that of each of the plurality of pattern layers 311, 312, and 313 to be realized in such a structure.

The plurality of wiring layers 411, 412, and 413 may include a plurality of core wiring layers 411 and a plurality of first and second build-up wiring layers 411 and 412 disposed on both sides of the plurality of core wiring layers 411 in the Y direction. The plurality of core wiring layers 411 may be disposed on both surfaces of the core insulating layer 111 in the Y direction. Each of the plurality of first and second build-up wiring layers 412 and 413 may be disposed on each of the plurality of first and second build-up insulating layers 112 and 113 in the Y direction.

Each of the plurality of wiring layers 411, 412, and 413 may be formed of a conductive material such as copper (Cu), aluminum (Al), silver (Ag), tin (Sn), gold (Au), nickel (Ni), lead (Pb), titanium (Ti), or alloys thereof.

Each of the plurality of wiring layers 411, 412, and 413 may be formed by a known plating process. For example, the plurality of wiring layers 411, 412, and 413 may be formed by forming electroless plating layers serving as seed layers on the plurality of insulating layers 111, 112, and 113 by electroless plating and forming electroplating layers on the seed layers by electroplating, respectively.

Each of the plurality of vias 421, 422, and 423 may penetrate through each of the plurality of insulating layers 111, 112, and 113. Each of the plurality of vias 421, 422, and 423 of the wiring portion 400 may be disposed on the same level as that of each of the plurality of via layers 321, 322 and 323 of the pattern portion 300. Each of the plurality of vias 421, 422, and 423 of the wiring portion 400 may be formed on each of the plurality of insulating layers 111, 112, and 113 by the same process as that of each of the plurality of via layers 321, 322, and 323 of the pattern portion 300 to be realized in such a structure.

Each of the plurality of vias 421, 422, and 423 may include a core via 421 and a plurality of first and second build-up vias 422 and 423 disposed on both sides of the core via 421 in the Y direction. The core via 421 may penetrate through the core insulating layer 111 in the Y direction and may connect the plurality of core wiring layers 411 disposed on both surfaces of the core insulating layer 111 to each other. The plurality of first and second build-up vias 422 and 423 may penetrate through the plurality of first and second build-up insulating layers 412 and 413 in the Y direction, respectively, and may connect the plurality of first and second build-up wiring layers 412 and 413 and the plurality of core wiring layers 411 to each other.

Each of the plurality of vias 421, 422, and 423 may be formed of a conductive material such as copper (Cu), aluminum (Al), silver (Ag), tin (Sn), gold (Au), nickel (Ni), lead (Pb), titanium (Ti), or alloys thereof.

Each of the plurality of vias 421, 422, and 423 may be formed by a known plating process. For example, the plurality of vias 421, 422, and 423 may be formed by via holes penetrating through the plurality of insulating layers 111, 112, and 113, forming electroless plating layers serving as seed layers on walls of the via holes by electroless plating, and forming electroplating layers on the seed layers by electroplating so as to fill the via holes, respectively. Each of the plurality of vias 421, 422, and 423 may have a boundary with each of the plurality of wiring layers 411, 412, and 413 or may be integrated with each of the plurality of wiring layers 411, 412, and 413 without having a boundary with each of the plurality of wiring layers 411, 412, and 413.

Each of vias included in each of the plurality of vias 421, 422, and 423 may be a filled-type via in which the via hole is completely filled with a metal or may be a via in which a metal is formed along the wall of the via hole. In addition, each of the vias included in each of the plurality of vias 421, 422, and 423 may have various shapes such as a tapered shape, an hourglass shape and the like.

According to one exemplary embodiment, the antenna substrate 1000A may further include a protective layer P disposed on at least one of the first surface 100T, the second surface 100B, and the side surface 100S of the body 100.

The protective layer P disposed on the first surface 100T of the body 100 may be disposed on the antenna portion 200. The protective layer P disposed on the second surface 100B of the body 100 may have openings exposing at least parts of the second build-up wiring layer 413. The protective layer P disposed on the side surface 100S of the body 100 may have openings exposing at least parts of the pad portions 300.

The protective layer P may be formed of an ABF, a solder resist (SR) or the like. However, the protective layer P is not limited thereto, and may be formed of a known insulating material.

Meanwhile, when an antenna substrate provided for a 5G antenna module is mounted on a set, the antenna substrate may have a large influence on 5G signal sensitivity according to a direction of an antenna due to strong rectilinearity of the 5G antenna module. In order to cope with such a problem, it may be considered to dispose two or more antenna modules including 5G antenna substrates in different directions. In this case, the antenna modules need to be vertically arranged on the set. To this end, it may be considered to connect the antenna modules to the set through a connector with a separate flexible printed circuit (FPC) cable board. However, in this case, loss of signal characteristics may occur due to connection through a cable, and there may also be a cost problem.

On the other hand, in the antenna substrate 1000A according to the exemplary embodiment, the pad portion 300 may be exposed to the side surface 100S of the body 100, as described above, such that the antenna portion 200 may be vertically disposed at the time of mounting the antenna substrate 1000A. Therefore, when the antenna substrate 1000A is applied to the 5G antenna module and is disposed on the set, an antenna having a vertical structure may be realized without using a separate FPC cable board and connector and efficiency improvement may be promoted through direct mounting of the vertical structure. In addition, the pattern layers 311, 312, and 313 and the via layers 321, 322, and 323 may be stacked in the Y direction to realize the pad portion 300 perpendicular to the antenna portion 200. Therefore, a structure of the pad portion 300 perpendicular to the antenna portion 200 may be easily realized in a substrate process.

Figure 6:
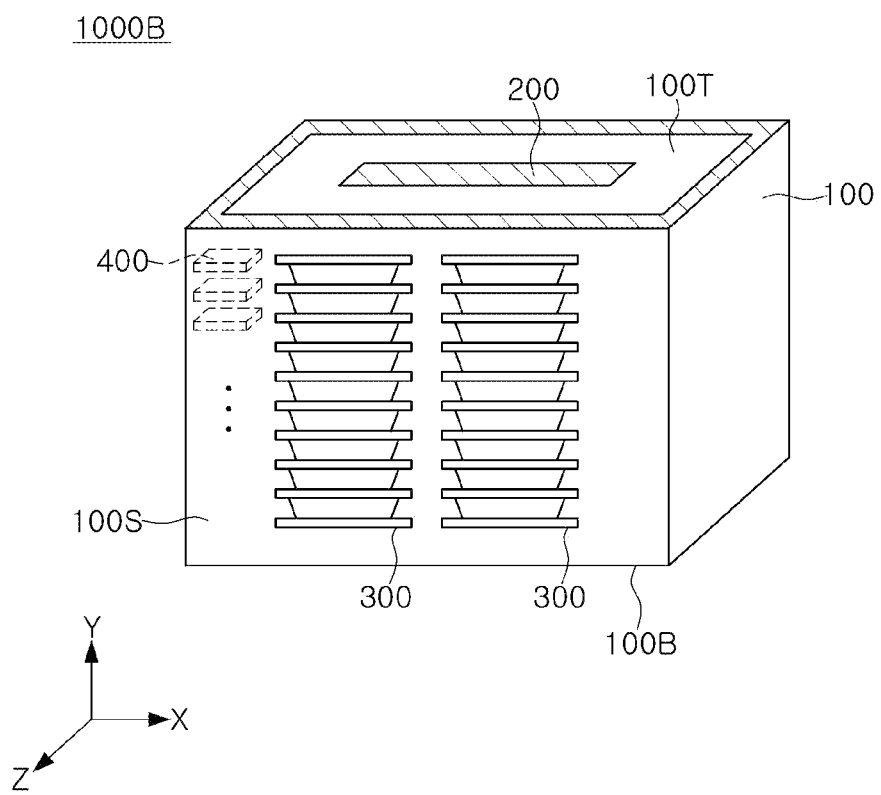
FIG. 6 is a schematic perspective view illustrating an antenna substrate according to another exemplary embodiment.

FIG. 6 is a schematic perspective view illustrating an antenna substrate according to another exemplary embodiment.

Figure 7:
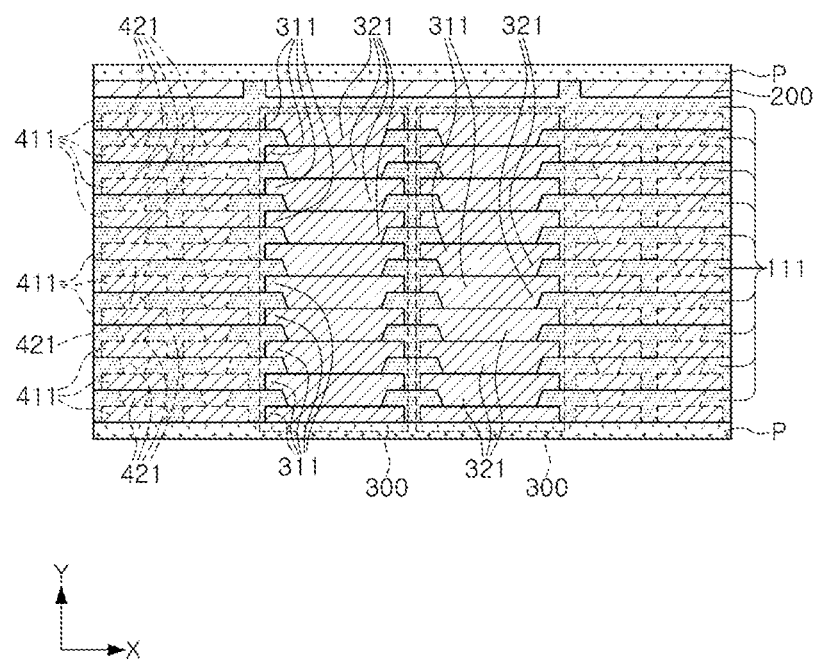
FIG. 7 is a cross-sectional view of the antenna substrate of FIG. 6 when viewed from a side surface of a body.

FIG. 7 is a cross-sectional view of the antenna substrate of FIG. 6 when viewed from a side surface of a body.

Figure 8:
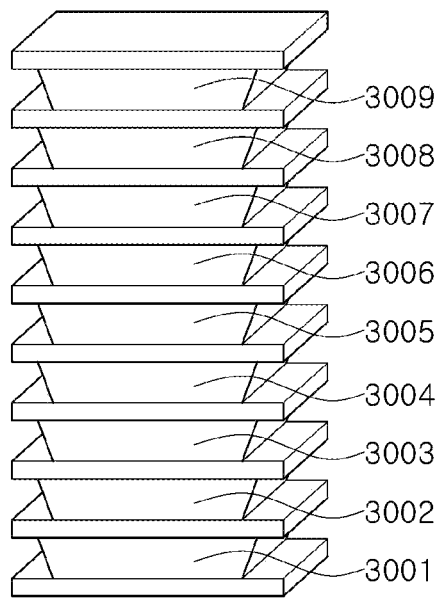
FIG. 8 is a schematic perspective view illustrating an example of a pad portion of FIG. 6.
Figure 8:
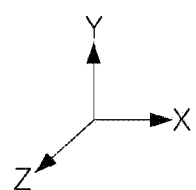

FIG. 8 is a schematic perspective view illustrating an example of a pad portion of FIG. 6.

Referring to FIGS. 6 through 8, an antenna substrate 1000B may has a coreless structure in which a core insulating layer, a core wiring layer, and a core via layer do not exist.

Specifically, each of pattern layers 311 included in a pad portion 300 may be disposed on each of insulating layers 111, and each of via layers 321 included in the pad portion 300 may penetrate through each of the insulating layers 111 to connect the pattern layers 311 disposed on different layers to each other.

In addition, each of wiring layers 411 included in a wiring portion 400 may be disposed on each of the insulating layers 111, and each of vias 421 included in the wiring portion 400 may penetrate through each of the insulating layers 111 to connect the wiring layers 411 disposed on different layers to each other.

A description of other configurations overlaps that described above in the antenna substrate 1000A, and a detailed description therefor is thus omitted.

Figure 9:
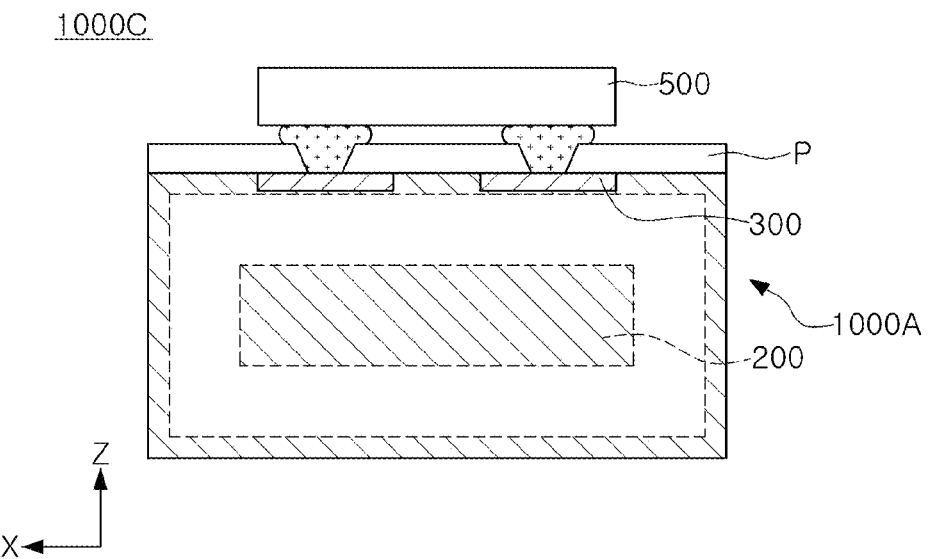
FIG. 9 is a schematic cross-sectional view illustrating an example in which the antenna substrate of FIG. 3 further includes an electronic component.

FIG. 9 is a schematic cross-sectional view illustrating an example in which the antenna substrate of FIG. 3 further includes an electronic component.

Referring to FIG. 9, an antenna substrate 1000C may further include an electronic component 500 disposed on the pad portion 300. The electronic component 500 may be disposed on the pad portion 300 and connected to the wiring portion 400.

The antenna substrate 1000C may include a protective layer P formed on the side surface 100S of the body 100 and having openings exposing at least parts of the pad portions 300, and the electronic component 500 may be disposed on the pad portions 300 in a surface mounting manner through connection conductors.

The electronic component 500 may include at least one of a PMIC, an RFIC, and a passive component. The passive component may be a chip-type passive component such as a chip-type capacitor, a chip-type inductor or the like, but is not limited thereto.

Figure 10:
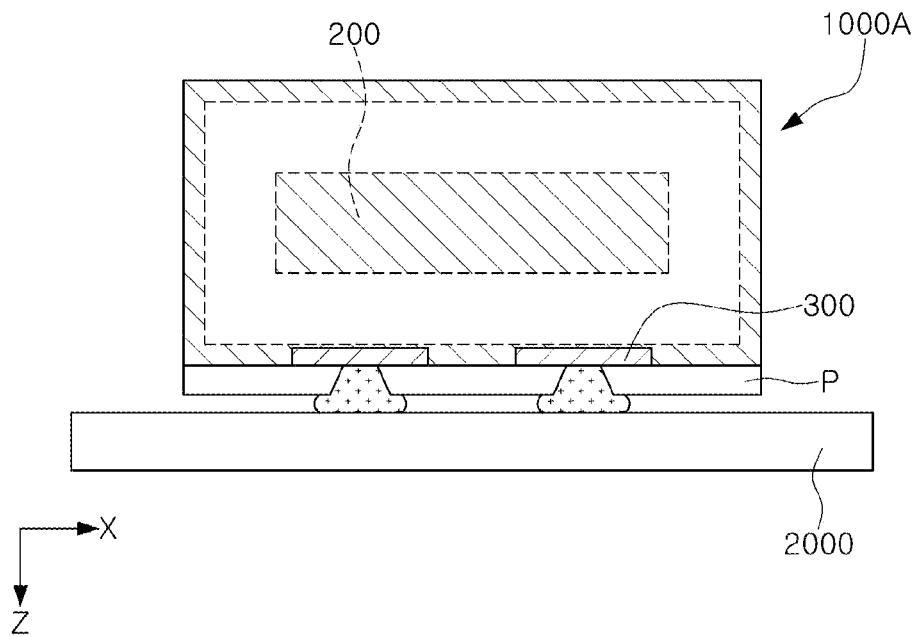
FIG. 10 is a schematic cross-sectional view illustrating an example in which the antenna substrate of FIG. 3 is mounted on another substrate.

FIG. 10 is a schematic cross-sectional view illustrating an example in which the antenna substrate of FIG. 3 is mounted on another substrate.

As described above, the antenna substrate 1000A may include a protective layer P formed on the side surface 100S of the body 100 and having openings exposing at least parts of the pad portions 300, and the antenna substrate 1000A may be disposed on another substrate 2000 in a surface mounting manner through connection conductors. Another substrate 2000 may be a main board, a motherboard or the like, but is not limited thereto.

As set forth above, according to the exemplary embodiment in the present disclosure, an antenna substrate capable of realizing an antenna having a vertical structure without using a separate cable substrate may be provided.

While exemplary embodiments have been shown and described above, it will be apparent to those skilled in the art that modifications and variations could be made without departing from the scope of the present invention as defined by the appended claims.

What is claimed is:

1. An antenna substrate comprising:
a body having a first surface and a second surface opposing each other and a side surface connecting the first surface and the second surface to each other;
an antenna portion disposed on the first surface of the body; and
a pad portion disposed in the body, exposed to the side surface of the body, and including a plurality of pad layers connected to each other in a first direction from the second surface of the body toward the first surface of the body,
wherein at least one of the plurality of pad layers has a greater width in a second direction than in a third direction perpendicular to the second direction when viewed in the first direction.

2. The antenna substrate of claim 1, wherein the second direction is a direction parallel to the side surface of the body, and
the third direction is a direction perpendicular to the side surface of the body.

3. The antenna substrate of claim 1, wherein a surface of the pad portion is substantially coplanar with the side surface of the body.

4. The antenna substrate of claim 1, wherein the antenna portion includes a patch antenna.

5. The antenna substrate of claim 1, wherein each of the plurality of pad layers includes a pattern layer and a via layer, and
the via layer connects the pattern layers included in adjacent pad layers of the plurality of pad layers to each other.

6. The antenna substrate of claim 5, wherein on the side surface of the body, a width of the pattern layer is greater than a width the via layer.

7. The antenna substrate of claim 6, wherein the body includes a plurality of insulating layers stacked in the first direction,
the plurality of pad layers are disposed on the plurality of insulating layers, respectively,
the pattern layer is disposed on each of the plurality of insulating layers, and
the via layer penetrates through each of the plurality of insulating layers.

8. The antenna substrate of claim 5, further comprising a wiring portion disposed in the body and including a plurality of wiring layers.

9. The antenna substrate of claim 8, wherein the pattern layer included in each of the plurality of pad layers is disposed on substantially the same level as a level of each of the plurality of wiring layers.

10. The antenna substrate of claim 5, wherein the via layer of each of the plurality of pad layers has a rectangular-shaped cross section when viewed in the first direction.

11. An antenna substrate comprising:
a body having a first surface and a second surface opposing each other and a side surface connecting the first surface and the second surface to each other;
an antenna portion disposed on the first surface of the body; and
a pad portion disposed in the body and including a plurality of pad layers each including a pattern layer and a via layer,
wherein the pattern layer and the via layer of each of the plurality of pad layers are exposed to the side surface of the body.

12. The antenna substrate of claim 11, wherein the pattern layer and the via layer of each of the plurality of pad layers have substantially coplanar surfaces with the side surface of the body.

13. An antenna substrate comprising:
a body;
an antenna portion disposed on a first surface of the body;
a pad portion disposed in the body, exposed to a side surface of the body perpendicular to the first surface of the body, and including a plurality of pad layers each including a pattern layer and a via layer; and
a wiring portion disposed in the body and including a plurality of wiring layers disposed on the plurality of insulating layers, respectively,
wherein on the side surface of the body, a width of the pattern layer is greater than a width the via layer,
the plurality of wiring layers are connected to one another by a via, and
the pattern layer included in each of the plurality of pad layers is disposed on substantially the same level as a level of each of the plurality of wiring layers.

14. The antenna substrate of claim 13, wherein the pattern layer and the via layer of each of the plurality of pad layers have substantially coplanar surfaces with the side surface of the body.

15. The antenna substrate of claim 13, wherein the via layer connects the pattern layers included in adjacent pad layers of the plurality of pad layers to each other.

16. The antenna substrate of claim 13, wherein the body includes a plurality of insulating layers stacked in a first direction in which the plurality of pad layers are stacked,
the plurality of pad layers are disposed on the plurality of insulating layers, respectively,
the pattern layer is disposed on each of the plurality of insulating layers, and
the via layer penetrates through each of the plurality of insulating layers.

17. The antenna substrate of claim 13, further comprising a protective layer disposed on at least one of the first surface of the body, a second surface of the body opposing the first surface, or the side surface of the body.

18. The antenna substrate of claim 13, wherein the via layer of each of the plurality of pad layers has a rectangular-shaped cross section when viewed in a first direction in which the plurality of pad layers are stacked.

* * * * *